United States Patent
David et al.

(10) Patent No.: US 8,222,888 B2
(45) Date of Patent: Jul. 17, 2012

(54) MICRO-POWER MAGNETIC SWITCH

(75) Inventors: Paul David, Bow, NH (US); Nevenka Kozomora, Manchester, NH (US); Gary T. Pepka, Pembroke, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 322 days.

(21) Appl. No.: 12/239,881

(22) Filed: Sep. 29, 2008

(65) Prior Publication Data

US 2010/0079138 A1    Apr. 1, 2010

(51) Int. Cl.
*G01B 7/00* (2006.01)
*G01R 33/06* (2006.01)

(52) U.S. Cl. .................. 324/207.13; 324/228; 324/244; 324/529

(58) Field of Classification Search ............ 324/207.11–207.25, 173, 529, 345, 210–263
See application file for complete search history.

(56) References Cited

U.S. PATENT DOCUMENTS

| | | | |
|---|---|---|---|
| 3,863,153 A | 1/1975 | Eshraghian | |
| 4,196,391 A | 4/1980 | Weber | |
| 5,493,218 A * | 2/1996 | Hayashi et al. | 324/207.21 |
| 5,619,137 A * | 4/1997 | Vig et al. | 324/251 |
| 6,084,406 A * | 7/2000 | James et al. | 324/253 |
| 6,194,896 B1 * | 2/2001 | Takahashi et al. | 324/252 |
| 6,229,299 B1 | 5/2001 | Strashny | |
| 6,297,627 B1 * | 10/2001 | Towne et al. | 324/207.12 |
| 6,356,741 B1 | 3/2002 | Bilotti et al. | |
| 6,424,182 B1 | 7/2002 | Plagens | |
| 6,473,255 B2 | 10/2002 | Hatanaka et al. | |
| 6,504,363 B1 | 1/2003 | Dogaru et al. | |
| 6,861,839 B2 * | 3/2005 | Hara et al. | 324/251 |
| 7,148,642 B2 | 12/2006 | Brannen et al. | |
| 7,268,526 B1 | 9/2007 | Smith | |
| 7,405,554 B2 | 7/2008 | Yao | |
| 7,755,349 B2 * | 7/2010 | James | 324/207.13 |
| 2001/0030537 A1 * | 10/2001 | Honkura et al. | 324/249 |
| 2004/0100251 A1 | 5/2004 | Lohberg | |
| 2005/0194964 A1 | 9/2005 | Okada et al. | |
| 2006/0006864 A1 | 1/2006 | Johnson et al. | |
| 2006/0071659 A1 | 4/2006 | Tatschi et al. | |
| 2006/0103547 A1 * | 5/2006 | Salser et al. | 340/870.02 |

(Continued)

FOREIGN PATENT DOCUMENTS

EP    0 019 827 A1    12/1980

OTHER PUBLICATIONS

Datasheet, Infineon Technologies, "TLE 4917, Low Power Hall Switch", Aug. 22, 2008 13 pages.

(Continued)

*Primary Examiner* — Jermele M Hollington
*Assistant Examiner* — Emily Chan
(74) *Attorney, Agent, or Firm* — Daly, Crowley, Mofford & Durkee, LLP

(57) ABSTRACT

A sensor having a power management mechanism controlled by an external trigger signal is presented. The sensor includes a magnetic field signal generating circuit and a control circuit coupled to the magnetic field signal generating circuit. The control circuit, responsive to an externally generated trigger signal, initiates a supply current pulse that activates the magnetic field signal generating circuit for a predetermined time interval.

20 Claims, 3 Drawing Sheets

U.S. PATENT DOCUMENTS

2008/0090683 A1 4/2008 Englert et al.
2008/0315865 A1* 12/2008 Doogue et al. ............... 324/173
2010/0052424 A1 3/2010 Taylor et al.

OTHER PUBLICATIONS

Datasheet, Diode Incorporated, "AH180, Micropower Omnipolar Hall-Effect Sensor Switch", Feb. 2007, 9 pages.
Datasheet, ELMOS Semiconductor AG, "E910.44, Ultra Low Power HALL-Sensor", Sep. 27, 2006, 5 pages.
Datasheet, IXYS, "MX887P, μPower Hall-Effect Switch" Jul. 19, 2007, 4 pages.
Datasheet, Panasonic, "AN48840B, AN48841B, Low current consumption, high sensitivity CMOS Hall IC Alternating magnetic field operation (For low-speed rotation detection)," Oct. 2006, 5 pages.
Datasheet, Toko, "Hall Sensor IC TK60011DS8/MC," undated, 12 pages.
Datasheet, Rohm, "BU52001GUL Hall Effect Switch," Apr. 2005, 6 pages.
Datasheet, Allegro Microsystems, Inc., "A3211, A3212 Micropower, Ultra-sensitive Hall-effect Switches," 2002, 2007, 12 pages.
Press Release and Datasheet, Allegro Microsystems, Inc., "A3422 Hall-Effect, Direction-Detection Sensors," undated, 11 pages.
Datasheet, E-CMOS, "EC2648-BL CMOS High Sensitivity Micropower Hall-Effect Switch," undated, 5 pages.
Datasheet, Diodes Incorporated, "AH1884 Micropower, Ultra-Sensitive Hall Effect Switch," Jul. 2007, 7 pages.
Notification of and International Search Report and Written Opinion of the International Searching Authority for PCT/US2008/062620, dated Oct. 1, 2008, 13 pages.
Notification of Transmittal of the International Search Report and the Written Opinion of the International Searching Authority, or the Declaration, PCT/US2009/050459 dated Oct. 8, 2009, 3 pages.
International Search Report, PCT/US2009/050459 dated Oct. 8, 2009, 3 pages.
Written Opinion of the International Searching Authority, PCT/US2009/050459 dated Oct. 8, 2009, 7 pages.
Notification Concerning Transmittal of International Preliminary Report on Patentability and International Preliminary Report on Patentability(Chapter 1 of the Patent Cooperation Treaty), PCT/US2008/062620, date of mailing Jan. 14, 2010, 8 pages.
From U.S. Appl. No. 11/767,549, filed Jun. 25, 2007, all dated Mar. 16, 2011, a Request for Continued Examination, a Response, and a Declaration under 37 CFR 1.131 with Exhibits, 39 pages.
Chinese Office Action dated Jan. 25, 2011 for Chinese Patent Application No. 200880021801.9 and the English translation thereof, 11 pages.
Letter dated Mar. 2, 2011 in response to Chinese Office Action dated Jan. 25, 2011 for Chinese Patent Application No. 200880021801.9, 7 pages.
U.S. Appl. No. 11/767,549, filed Jun. 25, 2007.
Second Office Action dated Aug. 31, 2011 for Chinese Patent Application No. 200880021801.9 and the English translation thereof, 13 pages.
Letter to Chinese associate dated Sep. 26, 2011 enclosing instructions for response to Office Action in Chinese Patent Application No. 200880021801.9, 29 pages.
Response to Office Action dated Mar. 28, 2011 from U.S. Appl. No. 11/767,549, filed Jun. 25, 2007, 8 pages.
Notice of Allowance dated Jun. 28, 2011 from U.S. Appl. No. 11/767,549, filed Jun. 25, 2007, 6 pages.
Notification and International Preliminary Report on Patentability with Written Opinion (Forms PCT/IB/326/373/237) for PCT/US2009/050459, dated Apr. 7, 2011, 8 pages.

* cited by examiner

MICRO-POWER MAGNETIC SWITCH

CROSS-REFERENCE TO RELATED APPLICATIONS

Not applicable.

STATEMENT REGARDING FEDERALLY SPONSORED RESEARCH

Not applicable.

FIELD OF THE INVENTION

This invention relates generally to magnetic field sensors and more particularly, to magnetic field sensors for use in low power applications.

BACKGROUND OF THE INVENTION

Magnetic field sensors for sensing a magnetic field in low power applications are known. Such sensors typically employ internal timing circuitry to activate portions of the device for a small percentage of the duty cycle.

SUMMARY OF THE INVENTION

In general, in one aspect, the invention is directed to a sensor. The sensor includes a magnetic field signal generating circuit and a control circuit, coupled to the magnetic field signal generating circuit and responsive to an externally generated trigger signal, to initiate a supply current pulse that activates the magnetic field signal generating circuit for a predetermined time interval.

Embodiments of the invention may include one or more of the following features. The sensor can further include a magnetic field signal processing circuit, coupled to the control circuit and the magnetic field signal generating circuit. The magnetic field signal processing circuit is activated by the supply current pulse to set a state for an output signal based on an output from the magnetic field signal generating circuit. The sensor can be provided with an input configured to receive a pulsed signal generated by an external controller as the externally generated trigger signal. Alternatively, the sensor can include a voltage supply input and be configured to use a pulsed power supply signal based on a supply signal received at the voltage supply input as the externally generated trigger signal. The control circuit can include a one-shot circuit to receive the externally generated trigger signal as a trigger input and to provide a one-shot output pulse in response. The control circuit can further include a switch, connected to the one-shot circuit, operable to provide the supply current pulse to the magnetic field signal generating circuit in response to the one-shot output pulse.

In another aspect, the invention is directed to a system that includes a controller and a sensor coupled to the controller. The sensor includes a magnetic field signal generating circuit and a control circuit coupled to the magnetic field signal generating circuit and responsive to an externally generated trigger signal, wherein the control circuit is operable to initiate a supply current pulse that activates the magnetic field signal generating circuit for a predetermined time interval.

BRIEF DESCRIPTION OF THE DRAWINGS

The foregoing features of the invention, as well as the invention itself, may be more fully understood from the following detailed description of the drawings, in which.

DETAILED DESCRIPTION

Figure 1:
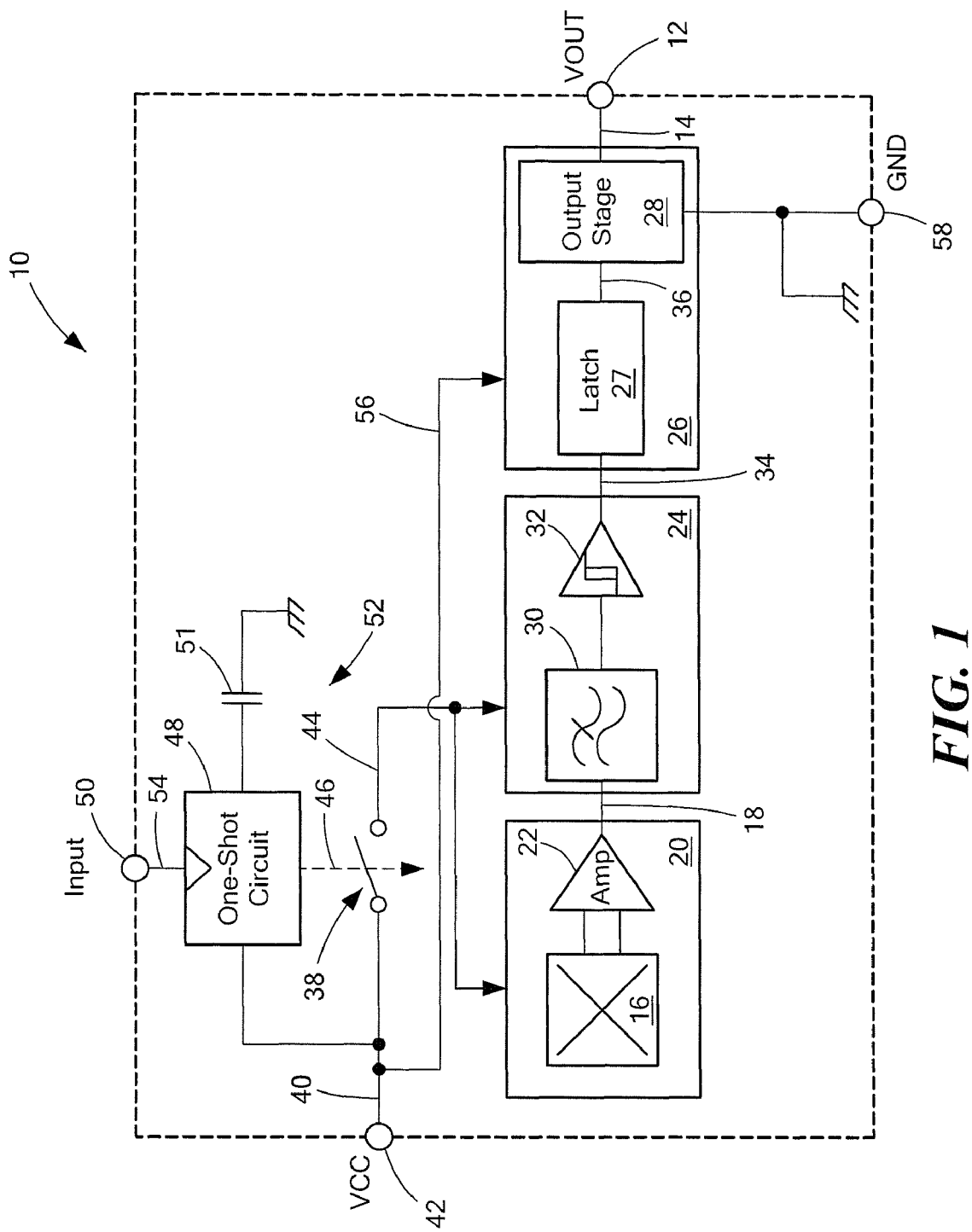
FIG. 1 shows an exemplary low power sensor that includes a one-shot circuit configured to receive an external control signal as a one-shot trigger input.

Referring to FIG. 1, a low power sensor 10 that employs an externally-generated signal to control its internal power consumption is shown. A low power sensor is one that would be suitable for use in limited power applications, such as battery-powered devices. In one embodiment, as depicted in FIG. 1, the sensor 10 is an output-switching type of magnetic field sensor. This type of sensor includes devices such as sensor switches (both unipolar and omnipolar, i.e., pole-independent) and latches. In a magnetic field sensing application, the sensor 10 is positioned in proximity to a magnetic article and provides at a sensor output (VOUT) 12 a sensor output signal 14 indicative of the presence of a magnetic field of a predetermined strength. The sensor 10 may be movable or fixed relative to the magnetic article.

The sensor 10 includes a magnetic field sensing element (also referred to as a magnetic field transducer) 16 that provides a magnetic field signal 18, for example, a voltage signal, proportional to the sensed magnetic field. The sensing element 16 may include a single magnetically responsive element or, alternatively, may include two or more such elements arranged in various configurations, e.g., a half bridge or full (Wheatstone) bridge. In the illustrative embodiment, the sensing element 16 is depicted as a single Hall-effect element. However, the sensor 10 can be any type of sensor and is therefore not limited to the Hall-effect sensor shown in FIG. 1. Thus, the element or elements of the sensing element 16 may take a form other than that of a Hall-effect element, such as a magnetoresistance (MR) element. An MR element may be made from any type of MR device, including, but not limited to: an anisotropic magnetoresistance (AMR) device; a giant magnetoresistance (GMR) device; and a magnetic tunnel junction (MTJ, also known as spin-dependent tunneling or "SDT") tunneling magnetoresistance (TMR) device.

The sensing element 16 is shown within a magnetic field signal generating circuit 20, which may contain various conventional circuits that operate collectively to generate the magnetic field signal 18. Generally, in addition to the sensing element 16, the circuit 20 contains at least an amplifier 22 for amplifying the output signal of the sensing element 16. The circuit 20 may implement chopper stabilization, by which a supply voltage is alternately connected to contacts of the Hall-effect element by a modulation switch circuit and the modulated signal is then demodulated by the amplifier in order to provide the magnetic field signal without offset voltage often associated with semiconductor Hall effect elements. Also, or alternatively, the circuit 20 may implement an offset adjustment feature, by which the magnetic field signal is centered within the power supply range of the sensor and/or a gain adjustment feature, by which the gain of the magnetic field signal is adjusted to maximize the peak-to-peak within the power supply range without causing clipping.

The sensor 10 further includes a magnetic field signal processing circuit 24 and an output circuit 26. The output circuit 26 is shown to include a latch 27 and an output stage 28. The circuit 24 is shown to include a low-pass filter 30 and a comparator circuit 32, which process the magnetic field signal 18 to produce a comparator output 34. The comparator output 34 is provided to the latch 27. The latch 27, responsive to the comparator circuit output 34, latches the state of that output. The output of the latch 27, latch output 36, is provided to the output stage 28, which serves to provide the sensor output signal 14 at the sensor output 12. The output stage 28 may be implemented as a totem-pole push-pull output configuration. Alternatively, the output stage could be implemented as a current source output structure that provides two levels of current representing two digital output states of the sensor. As the output current would be provided on the supply/ground lines, the use of a current source output structure would eliminate the need for the voltage output 12.

In order to achieve low power operation, the sensor 10 may be activated for a first time interval and deactivated for a second time interval. More particularly, power is applied to certain portions of the sensor 10 during the first time intervals (or "awake intervals") and is removed from those portions during the second time intervals (or "sleep intervals"). The measurement and subsequent processing that occurs during the awake intervals is referred to herein as "sampling" and thus, the awake intervals may be referred to alternatively as the "sample intervals" or "sample times."

Still referring to FIG. 1, a first control circuit or device 38 is provided to couple a power supply voltage VCC 40, provided by an external power supply at a VCC terminal or input 42, via a first VCC bus 44 to the circuits 20, 24, as shown. A control signal 46 is applied to the control circuit 38. In one embodiment, as illustrated in FIG. 1, the circuit 38 is provided by a switch. The switch could be, for example, a transistor such as a MOSFET device, or some other type of switching device. The switch 38 is closed (or turned on) to power the circuits 20, 24 when the control signal 46 is at a first signal level (e.g., a logic high level) and is opened (or turned off) to remove power from the circuits 20, 24 when the control signal is at a second signal level (e.g., a logic low level).

As shown in the illustrative embodiment of FIG. 1, the sensor 10 includes a second control circuit provided by a one-shot circuit 48. The one-shot circuit 48 is coupled between a sensor input 50 and the control circuit 38. It is also coupled to ground via a capacitor 51. Together, the first and second control circuits 38, 48, along with capacitor 51, form a larger control circuit 52. The one-shot circuit 48 is a device with a stable state that, responsive to an input signal, changes the state of its output for a period of time before returning to the stable state. More specifically, it responds to an input "transition", that is, it is edge-triggered. It may be designed for rising edge (active-high transition) triggering or falling edge (active-low transition) triggering. Dual-triggered input capability may be provided to allow the end-user the choice of positive or negative edge triggering. The one-shot circuit 48 produces a one-shot output pulse as the control signal 46 following a particular transition (or edge) of an externally-generated trigger signal 54 received at the sensor input 50.

The trigger signal 54 may be some type of control signal, for example, a pulsed or clocked signal. It is provided to the sensor 10 at the sensor input 50 by an external trigger generator (e.g., a controller or processor) to which the sensor 10 is coupled in an application. Thus, the trigger signal 54 causes the control circuit 52 to activate measurement and processing ("sampling") during the awake interval. That is, the triggering activates the circuit 20 to generate a magnetic field signal and the processing circuit 24 to use that magnetic field signal to set the output state, which is latched by the latch 27 with the beginning of the following sleep interval. More specifically, the one-shot circuit 48 produces an output pulse, the output 46, to turn on the switch 38 which, in turn, produces a supply current (ICC) pulse. The one-shot circuit 48 produces a single output pulse with each triggering event, whether it is a rising or falling edge of the input signal. The control circuit 52 thus initiates an ICC pulse according to timing, for example, a predetermined frequency, set by an external trigger generator. The circuits 20, 24 remain in sleep mode (drawing only a small amount of "sleep" current) until another one-shot output pulse 46 is applied to the switch 38 to activate circuits 20, 24 for operation in a new awake/sample interval.

The ICC pulse is of at least a predetermined, minimum duration, corresponding to the awake, or sample interval. The one-shot output pulse duration (and therefore the ICC pulse duration) is determined by values of internal timing of the one-shot circuit 48 and the capacitor 51. The sensor 10 requires a properly-timed ICC pulse for correct operation. Therefore, the control circuit 52 must be designed to provide the minimum time that the sensor circuits 20, 24 need to produce a valid sample. The trigger signal 54 could be smaller or larger than the resulting ICC pulse. As is known in the art, the one-shot circuit 48 may be provided with additional pulse control in the form of a re-trigger and/or a clear function, which allow the pulse duration to be extended or reduced, respectively. Re-triggering could be used to keep the sensor device operating in a full power mode (for 100% duty cycle), if desired.

The choice of capacitor for capacitor 51 can be made according to the timing and possibly other requirements of the application. It could be, for example, the type of structure described in U.S. patent application Ser. No. 12/198,191, entitled "Methods and Apparatus for Integrated Circuit Having Integrated Energy Storage Device," filed Aug. 28, 2008 with inventors William P. Taylor, Karl P. Scheller and Andrea Foletto, and assigned to Allegro Microsystems, Inc., the assignee of the subject application. Although a capacitor is shown in the figure, the use of other types of energy-storage devices, such as inductors, is contemplated as well.

The output stage 28 provides the sensor output 14 at a first signal level when a magnetic article is within a predetermined distance of the sensor and at a second signal level when the magnetic article is not within a predetermined distance of the sensor 10. The latch 27 operates to latch the state of the comparator output signal 34 on the falling edge of each current pulse which corresponds to the end of each awake interval. The latch 27 and output stage 28 are coupled to VCC directly via a second VCC bus 56. Internal circuitry of the sensor 10 is connected to ground through a GND terminal 58.

The sensor 10 may be provided in the form of an integrated circuit (IC) containing a semiconductor substrate on which the various circuit elements are formed. The interface of such an IC is indicated in the figure by dashed lines and would have at least one pin to correspond to each of: the input pin 50, VCC input or terminal 42, GND terminal 58 and, depending on the output stage implementation, the output (VOUT) 12. It will be appreciated that the functionality of the IC, that is, the circuit elements contained within it, can be varied to suit a particular application.

Figure 2:
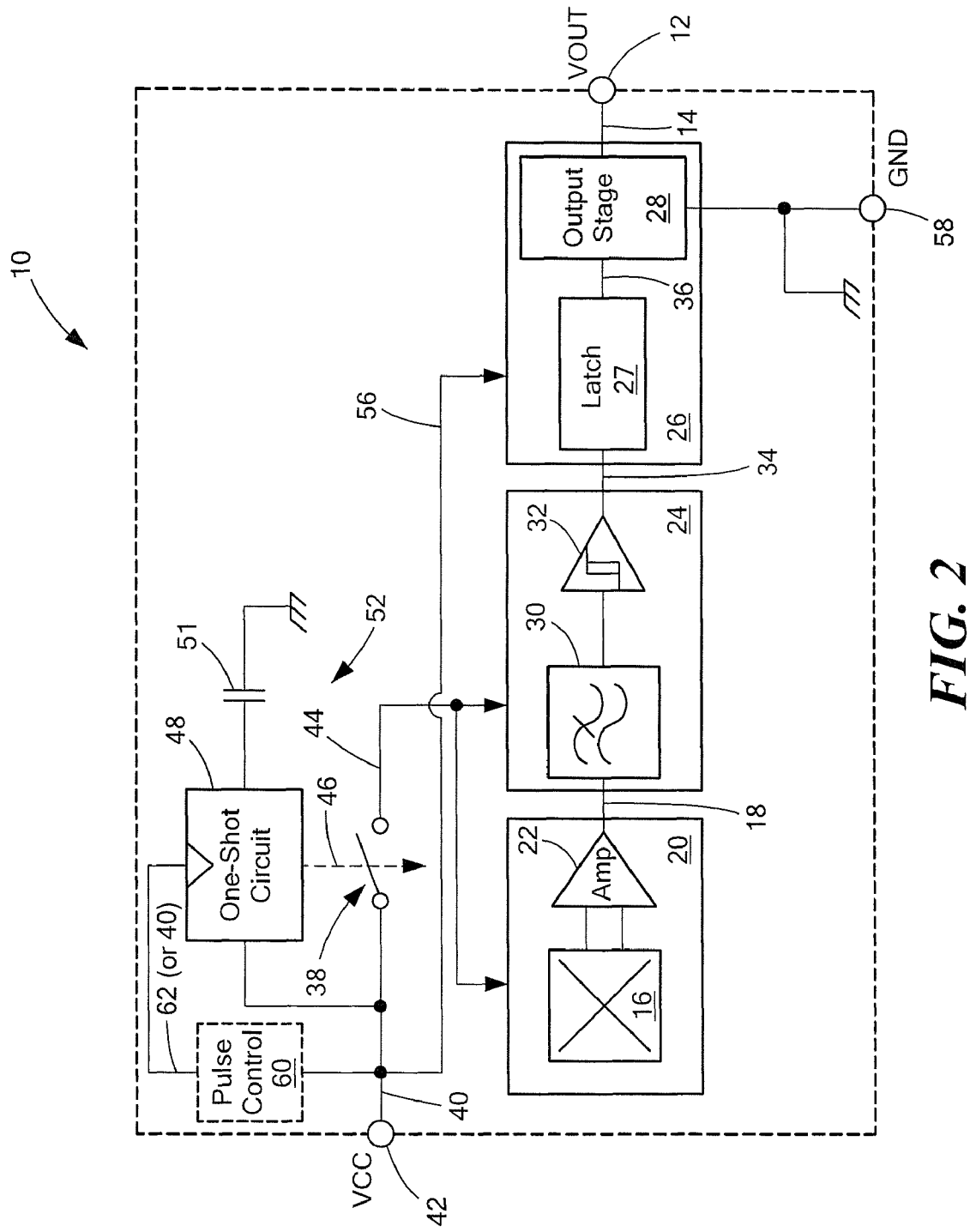
FIG. 2 shows an alternative exemplary low power sensor that includes a one-shot circuit configured to use a supply (VCC) signal as a one-shot trigger input.

Referring to FIG. 2, an alternative embodiment of sensor 10, shown as sensor 10', uses VCC as the one-shot trigger signal. In one implementation, as depicted in FIG. 2, the sensor 10' may include a pulse (or waveform) control device 60 between VCC 40 and the one-shot circuit 48. In such an implementation, a pulsed supply voltage signal is provided to the one-shot circuit 48 as a one-shot trigger signal 62. The pulse control device 60 may be a pulse generating circuit, including, for example, another one-shot circuit, a capacitor or inductor to couple the supply voltage signal 40 to the input of the one-shot circuit 48. In yet another implementation, VCC 40 may be tied directly to the input of the one-shot circuit. The design and/or inclusion of the device 60 in the sensor 10' will depend on the characteristics of the VCC signal 40 provided at VCC terminal 42. Some applications are known to provide a pulsed (or toggled) VCC, for example, via an external battery-saving circuit, to the sensor as the sensor's supply voltage. Other applications may use a constant supply voltage. There are, of course, techniques for developing a one-shot circuit with a forced signal fire start state as well. As mentioned above with respect to sensor 10 shown in FIG. 1, the output stage 28 in the sensor 10' may be implemented as a current source output structure. In a current source output structure implementation, as noted earlier, a current output is provided between the VCC and GND terminals. This type of output stage may make the sensor 10' more attractive for use in applications that require a 2-wire interface for a lower cost wiring harness.

Figure 3:
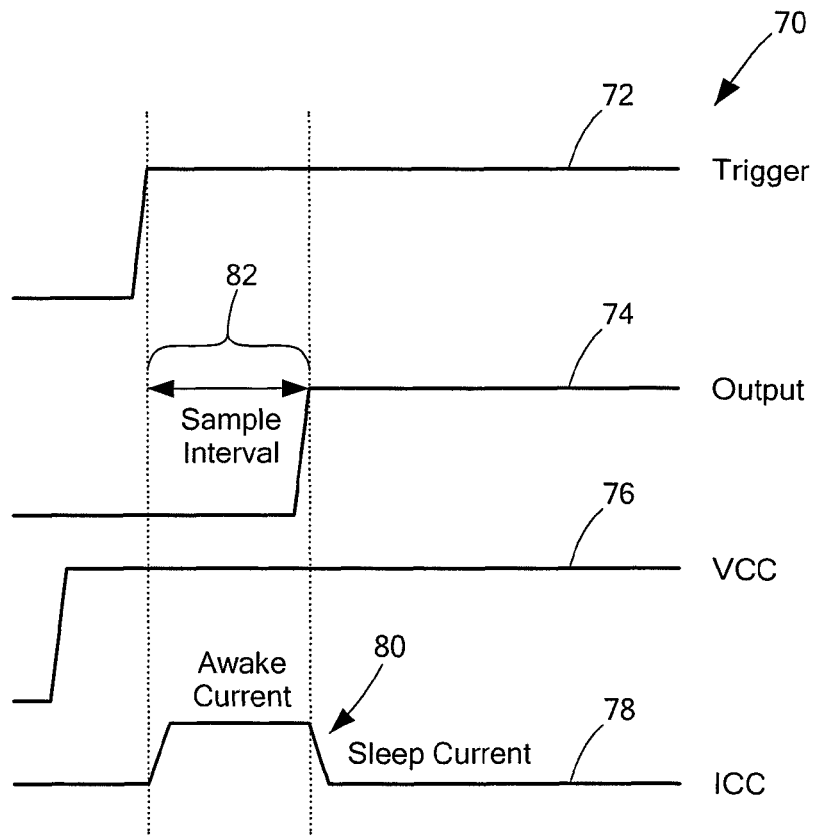
FIG. 3 shows various sensor signal waveforms for low power operation.

FIG. 3 shows illustrative signal waveforms 70 for low power sensor operation based on a trigger signal as described above with reference to FIGS. 1-2. Referring to FIGS. 1-3, waveforms 70 include: a waveform 72 corresponding to the trigger signal 54 (FIG. 1) or trigger signal 62 (FIG. 2), a waveform 74 corresponding to the output 34; a waveform 76 corresponding to VCC 40; and a waveform 78 corresponding to the supply current, ICC. It will be appreciated that in an embodiment in which VCC signal 40 is provided directly to the one-shot circuit input, as discussed above with reference to FIG. 2, the trigger signal waveform would also be the VCC waveform. In the example shown, the timing sequence for a sampling operation begins with the trigger signal (waveform 72) transitioning to a high level. In response to this transition, the one-shot circuit 48 produces an output pulse to close (or turn on) the switch 38. The switch 38 then produces a supply current (or ICC) pulse 80. The supply current pulse 80 corresponds to the supply current provided to circuits 20, 24 during a sample interval 82. The sample interval 82 defines the period in which a magnetic field strength measurement is taken and processed (as described above). The sample interval 82 ends with the state of the output signal 34 (waveform 74) being updated, here it is shown as transitioning to a high level. That is, the illustrated example is based on a magnetic field level that associates to an output change. At the end of the sample interval 82, the supply current goes from an awake current value to a sleep current value and remains at that level until another ICC pulse is initiated by the next trigger rising edge. The output data generated during the sample time is latched on the falling edge of the current pulse and held until the next sample occurs.

A typical ICC current during the sample/awake interval may be about 1.5 mA. In the "sleep" interval, a typical ICC sleep current may be less than 75 nA. Thus, the current drawn by the low power mode during the sleep interval is a significant reduction in power over that consumed during the awake interval. An end-user, after determining how often measurements have to be updated for a given application, can set the wake-up rate of the sensor 10 (or 10') to the minimum allowed by the application, prolonging the period in which the circuits 20, 24 are in sleep mode (thus reducing power consumption).

As mentioned above, with reference to FIG. 2, the output stage can be adapted for a 2-wire configuration. In the 2-wire configuration, with a pulsed VCC trigger, if the output goes to a high output current state (assuming the sensor 10' experiences an appropriate magnetic signal), it stays in that state until the sensor is re-powered and the next sampling occurs. Otherwise, the output remains in the low current output state.

This low power triggering technique for an automatic on/off control of low power operation can apply to any type of digital output switching sensor, including switches and latches. It could also be employed in other types of sensors, for example, sensors having internal architectures (circuits 20, 24, 26) adapted for linear and current sensing applications. In particular, some current sensing applications, such as industrial or home power monitoring applications, may not require an instantaneous current measurement. Taking current measurements at sampling times according to the low power triggering technique may be more than adequate. To support such operation, it may be desirable to include in or as part of the output structure 26 for sensor 10, 10' that operates as a current sensor an analog-to-digital converter to produce a digital representation of an analog current level and latches to hold that digital representation. The low power triggering technique would be useful for any sensor design that requires low sample rates and, moreover, sample times that are not internal clock dependent.

The sensor 10, 10' may be suitable for a wide range of low power end-user applications. It is particularly attractive for battery-operated equipment, such as mobile (e.g., cellular and cordless) telephones, portable media players, handheld gaming devices, mobile PCs (including pagers, palmtop or handheld computers, personal digital assistants, and the like), as well as industrial metering and mechanical switch (e.g., reed switch) replacements. The reduction of the power consumption would prolong the availability of battery-powered functions and also enable reduction of the battery size and weight. In particular, in mobile phone applications, the low power sensor 10, 10', may be used for an opened-or-closed lid detection scheme—operating to switch on if the lid is opened and switch off of the lid is closed, for example. This type of operation can be applied to other battery powered devices with a lid/cover, e.g., digital camera or camera phone.

Figure 4:
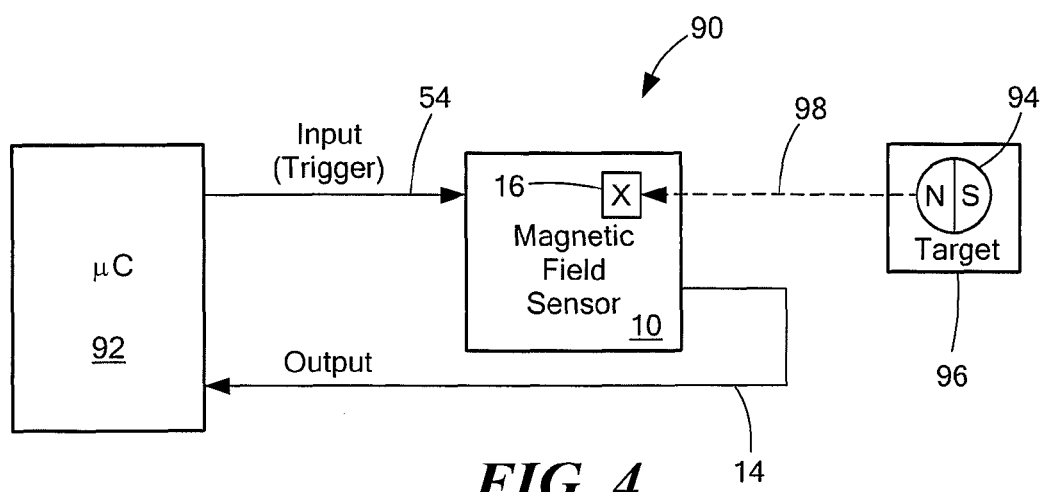
FIG. 4 shows an exemplary application in which a low power sensor such as that depicted in FIGS. 1-2 is employed.

FIG. 4 shows a simplified depiction of an application 90 that employs the sensor 10 (or sensor 10') for low power sensing. The application 90 includes a trigger generator, shown as microcontroller or processor 92, coupled to the sensor 10. The sensor 10 is arranged in close proximity to a magnetic flux source 94, shown as a magnetic article 94 located in a target portion ("target") 96, of the application. The magnetic flux source 94 could, of, course, be any device or structure that produces magnetic flux in a given magnetic field sensing application. It may be implemented to include a permanent magnet, such as a ring magnet or two-pole magnet. That magnet may be coupled to or mounted within a "target" device, i.e., an object to be sensed, such as a moving or rotating device. Other possible magnetic flux sources can include electromagnets (e.g., current carrying wire conductors and coils), such as those used in current sensing applications, magnet/coil assemblies and other current carrying devices that produce magnetic fields.

The processor 92 provides the input trigger signal 54 to the sensor 10, more specifically, the one-shot circuit 48 (from FIGS. 1-2). The sensing element 16 of the sensor 10 senses a magnetic field 98 associated with the magnetic article 94, and subsequently generates the sensor output signal 14. In the illustrated application, the output signal 14 is provided to the processor 92 (but could instead be provided to some other device). Alternatively, the controller or a power source could supply a VCC signal (that the sensor uses as VCC trigger signal 40 or to produce VCC trigger signal 62, as shown in FIG. 2) in lieu of the trigger signal 54.

In a flip-phone with an opened-or-closed lid (or cover) detection scheme, as discussed above, the magnetic article 94 can be located in the cover (corresponding to the target portion 96) and the sensor 10 and microcontroller 92 can be located in the base of the phone. In such an arrangement, the output signal 14 provides an indication of whether the cover is open or closed based on whether a magnetic field of a predetermined strength is detected.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A sensor comprising:
    a magnetic field signal generating circuit;
    a control circuit, coupled to the magnetic field signal generating circuit and responsive to an externally generated trigger signal, to initiate a supply current pulse that activates the magnetic field signal generating circuit for a predetermined time interval; an input configured to receive a pulsed signal generated by an external microcontroller as the externally generated trigger signal; and wherein the supply current pulse has a duration that is determined by the control circuit.

2. The sensor of claim 1 further including a magnetic field signal processing circuit, coupled to the control circuit and the magnetic field signal generating circuit, wherein the magnetic field signal processing circuit is activated by the supply current pulse to set a state for an output signal based on an output from the magnetic field signal generating circuit.

3. The sensor of claim 1 further comprising a voltage supply input, and wherein the sensor is configured to use a pulsed power supply signal based on a supply signal received at the voltage supply input as the externally generated trigger signal.

4. The sensor of claim 1 wherein the magnetic field signal generating circuit includes a sensing element that comprises at least one Hall-effect element.

5. The sensor of claim 1 wherein the magnetic field signal generating circuit includes a sensing element that comprises at least one magnetoresistance (MR) element.

6. The sensor of claim 1 wherein the control circuit comprises a one-shot circuit to receive the externally generated trigger signal as a trigger input and to provide a one-shot output pulse in response thereto.

7. The sensor of claim 1 wherein the supply current pulse defines an awake interval during which the magnetic field signal generating circuit is activated, and the time between the supply current pulse and a next supply current pulse defines a sleep interval during which the magnetic field signal generating circuit is deactivated.

8. The sensor of claim 1 wherein the magnetic field signal generating circuit and the control circuit are integrated as a semiconductor integrated circuit.

9. A sensor comprising:
    a magnetic field signal generating circuit;
    a control circuit, coupled to the magnetic field signal generating circuit and responsive to an externally generated trigger signal, to initiate a supply current pulse that activates the magnetic field signal generating circuit for a predetermined time interval;
    wherein the control circuit comprises a one-shot circuit to receive the externally generated trigger signal as a trigger input and to provide a one-shot output pulse in response thereto; and
    wherein the control circuit further comprises a switch, connected to the one-shot circuit, operable to provide the supply current pulse to the magnetic field signal generating circuit in response to the one-shot output pulse.

10. A system comprising:
    a controller; and
    a sensor, coupled to the controller, the sensor including a magnetic field signal generating circuit and a control circuit coupled to the magnetic field signal generating circuit and responsive to an externally generated trigger signal, wherein the control circuit is operable to initiate a supply current pulse that activates the magnetic field signal generating circuit for a predetermined time interval, wherein the controller comprises a microcontroller and the sensor further includes an input configured to receive a pulsed signal generated by the microcontroller as the externally generated trigger signal and wherein the supply current pulse has a duration that is determined by the control circuit.

11. The system of claim 10 wherein the sensor further includes a magnetic field signal processing circuit, coupled to the control circuit and the magnetic field signal generating circuit, wherein the magnetic field signal processing circuit is activated by the supply current pulse to set a state for an output signal based on an output from the magnetic field signal generating circuit.

12. The system of claim 10 wherein the sensor further comprises a voltage supply input, and wherein the sensor is configured to use a pulsed power supply signal based on a supply signal received at the voltage supply input as the externally generated trigger signal.

13. The system of claim 10 wherein the magnetic field signal generating circuit includes a sensing element that comprises at least one Hall-effect element.

14. The system of claim 10 wherein the magnetic field signal generating circuit includes a sensing element that comprises at least one magnetoresistance (MR) element.

15. The system of claim 10 wherein the control circuit comprises a one-shot circuit to receive the externally generated trigger signal as a trigger input and to provide a one-shot output pulse in response thereto.

16. A system comprising:
    a controller;
    a sensor, coupled to the controller, the sensor including a magnetic field signal generating circuit and a control circuit coupled to the magnetic field signal generating circuit and responsive to an externally generated trigger signal, wherein the control circuit is operable to initiate a supply current pulse that activates the magnetic field signal generating circuit for a predetermined time interval;
    wherein the control circuit comprises a one-shot circuit to receive the externally generated trigger signal as a trigger input and to provide a one-shot output pulse in response thereto; and
    wherein the control circuit further comprises a switch, connected to the one-shot circuit, operable to provide the supply current pulse to the magnetic field signal generating circuit in response to the one-shot output pulse.

17. The system of claim 10 wherein the magnetic field signal generating circuit and the control circuit are integrated as a semiconductor integrated circuit.

18. The system of claim 10 wherein the supply current pulse defines an awake interval during which the magnetic field signal generating circuit is activated, and the time between the supply current pulse and a next supply current pulse defines a sleep interval during which the magnetic field signal generating circuit is deactivated.

19. A sensor integrated circuit comprising:
   an input to receive an externally generated trigger signal comprising pulses;
   a magnetic field signal generating circuit; and
   a control circuit, coupled to the magnetic field signal generating, comprising a first control circuit and a second control circuit, the second control circuit being responsive to an edge of each pulse of the externally generated trigger signal to produce an output pulse and the first control circuit being responsive to each output pulse to initiate a supply current pulse that activates the magnetic field signal generating circuit for a predetermined time interval.

20. The sensor of claim 19, wherein the supply current pulse has a duration that is determined by the second control circuit.

* * * * *

UNITED STATES PATENT AND TRADEMARK OFFICE
CERTIFICATE OF CORRECTION

PATENT NO. : 8,222,888 B2  
APPLICATION NO. : 12/239881  
DATED : July 17, 2012  
INVENTOR(S) : Paul David, Nevenka Kozomora and Gary T. Pepka It is certified that error appears in the above-identified patent and that said Letters Patent is hereby corrected as shown below:

Column 6, line 33, delete "of the" and replace with --if the--.

Column 9, line 8, delete "," and replace with --circuit,--.

Signed and Sealed this  
Twelfth Day of February, 2013

Teresa Stanek Rea  
*Acting Director of the United States Patent and Trademark Office*